United States Patent
Krueger et al.

(10) Patent No.: US 7,317,778 B2
(45) Date of Patent: Jan. 8, 2008

(54) PHASE-LOCKED LOOP CONTROL CIRCUIT

(75) Inventors: Daniel Krueger, Fort Collins, CO (US); Daniel Alan Berkram, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 719 days.

(21) Appl. No.: 10/355,516

(22) Filed: Jan. 31, 2003

(65) Prior Publication Data
US 2004/0151271 A1    Aug. 5, 2004

(51) Int. Cl.
*H03D 3/24*    (2006.01)
(52) U.S. Cl. ........................... 375/376; 375/375
(58) Field of Classification Search ........... 375/376, 375/375
See application file for complete search history.

(56) References Cited

U.S. PATENT DOCUMENTS

| | | | |
|---|---|---|---|
| 4,365,211 A | * | 12/1982 | Lee .............................. 331/11 |
| 4,542,351 A | * | 9/1985 | Okada .......................... 311/11 |
| 4,596,963 A | * | 6/1986 | Lawton et al. ................ 331/14 |
| 4,787,097 A | * | 11/1988 | Rizzo .......................... 375/375 |
| 5,955,928 A | | 9/1999 | Smith et al. |
| 5,982,239 A | * | 11/1999 | Takahashi et al. ............ 331/11 |
| 6,407,600 B1 | | 6/2002 | Lu et al. |

FOREIGN PATENT DOCUMENTS

JP    10013224    1/1998

* cited by examiner

*Primary Examiner*—Kevin Kim

(57) ABSTRACT

An electrical circuit is disclosed, which comprises a phase locked loop (PLL) circuit and a PLL start-up circuit configured to selectively provide a reference signal to the phase locked loop circuit based upon relative frequencies of an input signal to the phase locked loop circuit and an output signal of the phase locked loop circuit.

Further, a method for controlling a phase locked loop circuit is disclosed, which comprises the step of selectively providing a reference signal to the phase locked loop circuit in response to relative frequencies of an input signal to the phase locked loop circuit and an output signal of the phase locked loop circuit.

21 Claims, 2 Drawing Sheets

PHASE-LOCKED LOOP CONTROL CIRCUIT

BACKGROUND

Phase-Locked Loop ("PLL") circuits are electrical circuits that are commonly used for controlling the frequency of digital and analog electrical signals while maintaining a constant phase. For example, PLL circuits can be configured as frequency multipliers, demodulators, tracking generators or clock recovery circuits.

FIG. 1 schematically illustrates a PLL circuit 10 configured as a frequency multiplier. A purpose of the PLL circuit 10 in FIG. 1 is to generate an output frequency signal, CKfb, which is a multiple of and in phase with an input frequency signal CKin. Accordingly, the PLL circuit 10 multiplies the frequency of the input signal CKin, while maintaining a constant phase. The illustrative PLL circuit 10 includes a first frequency divider 14, a phase detector 16, a charge pump 18, a voltage-controlled oscillator 20, and a second frequency divider 22. The voltage-controlled oscillator (VCO) 20 is configured to generate an output signal (shown as signal CKout in FIG. 1), the frequency of which is controlled by an input voltage to the VCO 20. In certain applications, the output signal CKout can be provided to clock distribution circuitry 26, which distributes the CKout signal to a variety of other electronic components, as shown in FIG. 1. The input voltage to the VCO 20 is a signal from the charge pump 18, which is adjusted to cause the PLL to lock. The phase detector 16 compares the respective phases of the input signal CKin and the feedback signal CKfb and generates an output signal based upon the difference between the two phases. Frequency divider 14 and frequency divider 22 are used to modify the frequency of the input signal CKin to a desired frequency for the output and feedback signals CKout and CKfb. In particular, frequency divider 22 is configured to decrease the frequency of the CKfb feedback signal, which, because of the nature of the PLL circuit 10, ultimately tends to multiply the frequency of the output signal CKout and CKfb relative to the input signal CKin. Similarly, frequency divider 14 is configured to reduce the frequency of the output signal CKout and CKfb relative to the input signal CKin. One of ordinary skill in the art will recognize that the specifications of the frequency dividers 14 and 22 can be varied relative to each other to generate a wide variety of different output frequencies CKout and CKfb for a given input frequency CKin.

In operation, the PLL circuit 10 set forth in FIG. 1 functions as follows. The Vcntl voltage signal is applied to the VCO 20, which generates an output signal CKout having a frequency that corresponds to the Vcntl voltage signal. The CKout signal propagates through the clock distribution circuitry 26 producing a phase-delayed feedback version of CKout, referred to as CKfb. When an input signal CKin is provided to the PLL circuit 10, the phase detector 16 detects a difference in the signal phase between the input signal CKin and the feedback signal CKfb. The output of the phase detector 16 and charge pump 18 is a voltage signal that corresponds to the phase difference detected by the phase detector 16. The voltage signal is provided to the VCO 20, which ultimately adjusts the frequency of output signal CKout. The feedback loop of the output signal CKout to CKfb causes the phase of the output signal CKfb to "lock" on the phase of the input signal CKin. As indicated above, the frequency dividers 14 and 22 are configured to adjust the frequency of the output signals CKout and CKfb by a particular factor relative to the input signal CKin. For example, in FIG. 1, if frequency divider 22 is configured to divide the frequency of the feedback signal CKfb by a factor of X, and if the frequency divider 14 is configured to divide the frequency of the input signal CKin by a factor of Y, the output signal CKout will ultimately have a frequency that is X/Y times the frequency of the input signal CKin.

PLL circuits, like the illustrative PLL circuit 10 shown in FIG. 1, can be "started" in a variety of ways. For example, it is known to apply a Vref signal to the PLL control voltage Vcntl for an extended period of time to "start" the PLL circuit generating an oscillating output signal. However, depending on the level of the Vref signal, the PLL circuit may not always start or it may start too fast. For example, if the Vref signal is too low, the frequency of the output signal CKout from the VCO 20 may be too low for the PLL to "lock" on an input frequency. Conversely, if the Vref signal is too high, the frequency of the output signal CKout may be greater than the maximum frequency of the clock distribution circuitry 26, which may damage the clock distribution circuitry 26 and/or provide inaccurate output signals. For instance, if the frequency of the CKout signal exceeds the maximum input frequency of the clock distribution circuitry 26, then the feedback signal CKfb will not contain all the clock edges of CKout. CKfb will appear to be a lower frequency than CKout, rather than just a phase-delayed version of CKout. This could cause the PLL circuit 10 to increase the frequency of the CKout signal, thereby perpetuating the problem.

SUMMARY

An electrical circuit is disclosed, which comprises a phase locked loop (PLL) circuit and a PLL start-up circuit. The PLL start-up circuit is configured to selectively provide a reference signal to the phase locked loop circuit based upon relative frequencies of an input signal to the phase locked loop circuit and an output signal of the phase locked loop circuit.

Further, an electrical circuit for controlling a phase locked loop circuit is disclosed. The electrical circuit comprises at least one comparator configured to compare respective frequencies of an input signal to the phase locked loop circuit and an output signal of the phase locked loop circuit. The circuit also includes a reference signal configured to be selectively provided to the phase locked loop circuit in response to said comparison of said respective frequencies of said input signal and said output signal.

Further, a method for controlling a phase locked loop circuit is disclosed, which comprises the step of selectively providing a reference signal to the phase locked loop circuit in response to relative frequencies of an input signal to the phase locked loop circuit and an output signal of the phase locked loop circuit.

Further, an electrical circuit is disclosed, comprising a phase locked loop circuit, and a means for selectively providing a reference signal to the phase locked loop circuit in response to relative frequencies of an input signal to the phase locked loop circuit and an output signal of said phase locked loop circuit.

DETAILED DESCRIPTION

Figure 1:
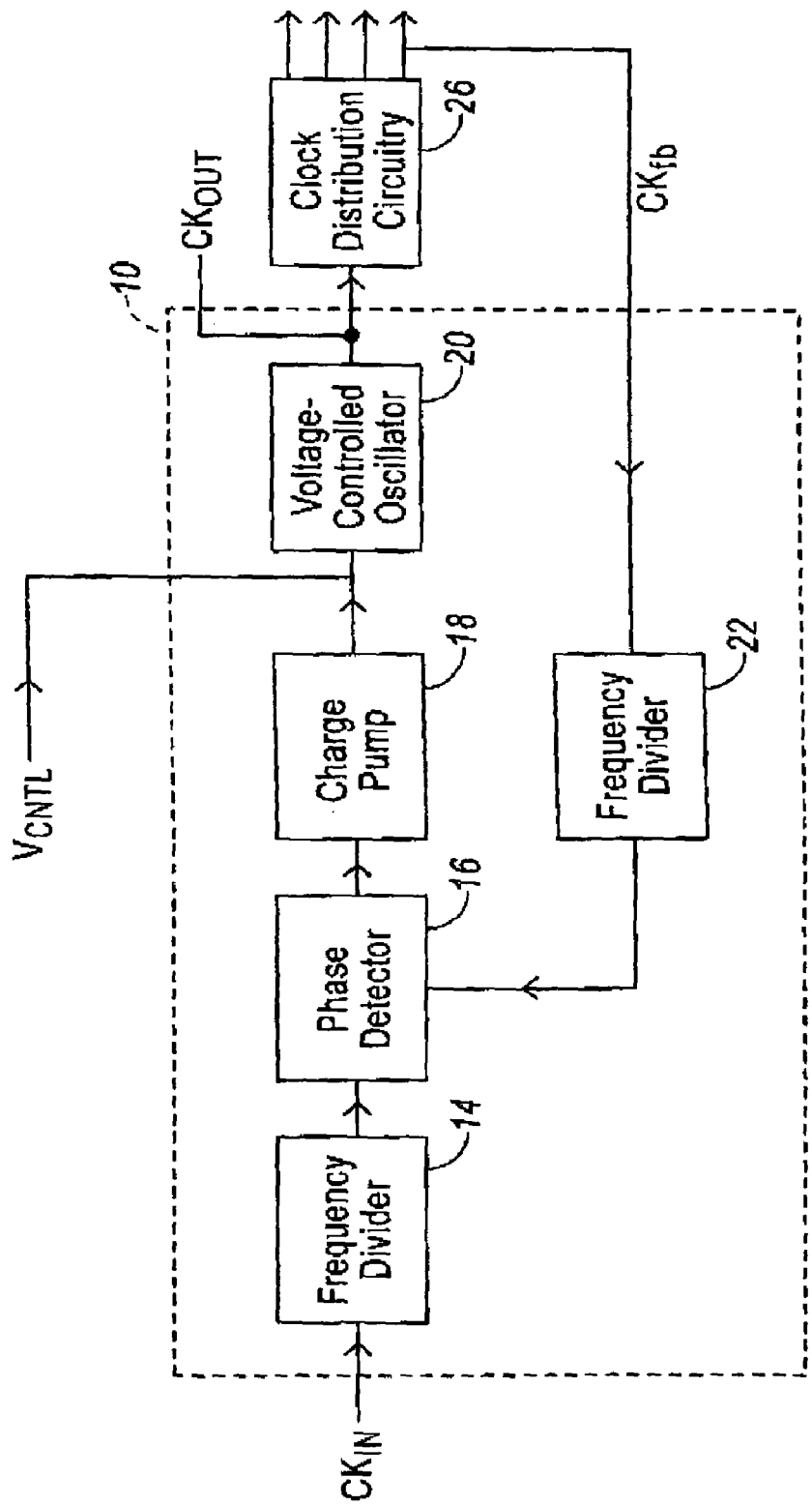
FIG. 1 is a schematic circuit diagram of an exemplary Phase Locked Loop circuit coupled to clock distribution circuitry.
Figure 2:
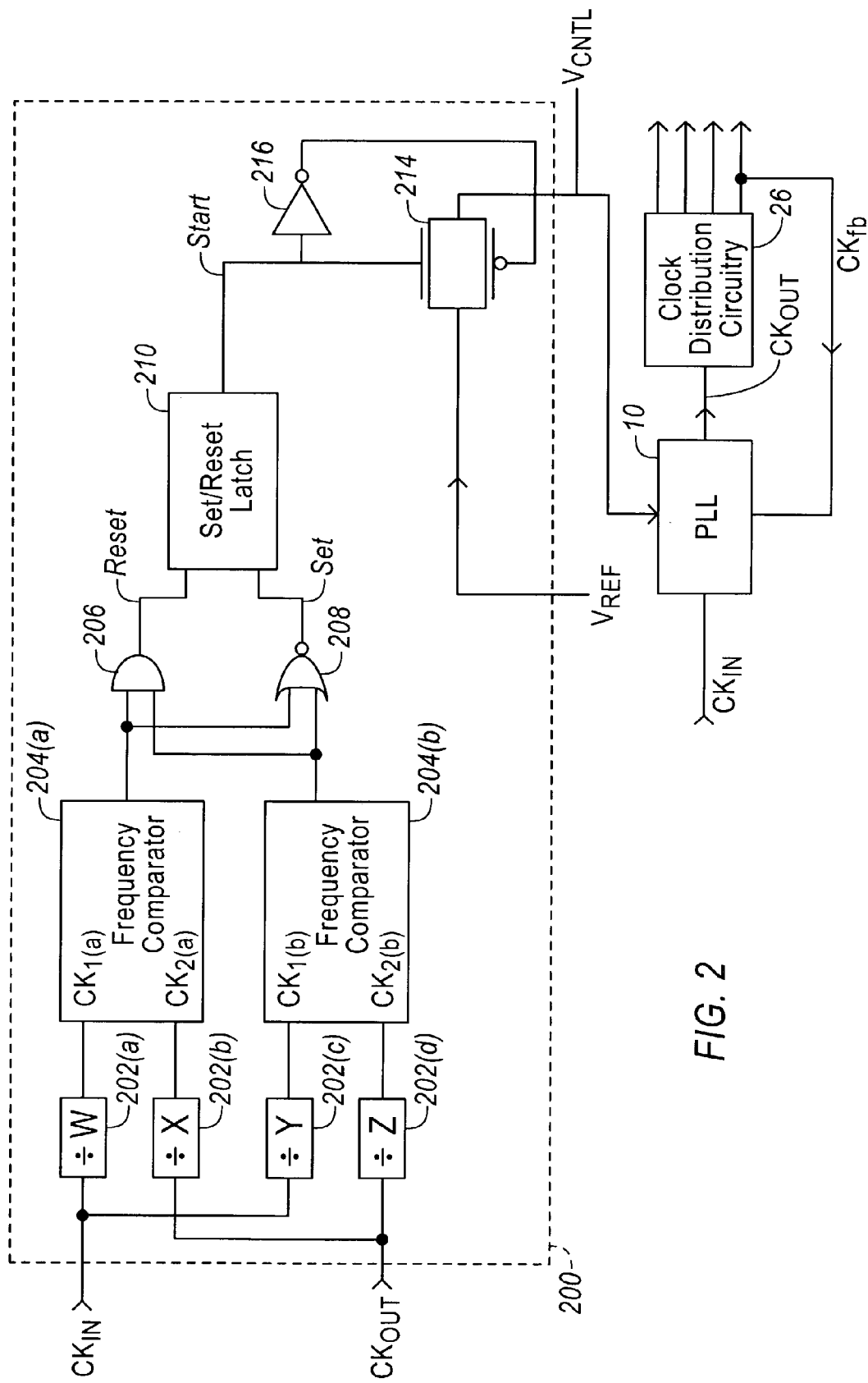
FIG. 2 is a schematic circuit diagram of a PLL start-up circuit, according to an embodiment of the invention.

FIG. 2 sets forth an illustrative embodiment of a PLL start-up circuit 200, according to an embodiment of the invention. The purpose of the PLL start-up circuit is to provide a Vref signal to the PLL control voltage Vcntl (to activate the VCO 20) in a controlled and selective manner. That is, the PLL start-up circuit selectively provides the Vref signal to Vcntl based upon certain conditions. In particular, the illustrative embodiment of the PLL start-up circuit 200 provides the Vref signal to Vcntl (to "start" the PLL circuit) when the frequency of the output signal CKout falls below a certain fraction of the frequency of the input signal CKin, indicating that the PLL circuit has either not yet "started" or, if already running, has begun to stop. Conversely, the PLL start-up circuit 200 cuts off the Vref signal from Vcntl when the frequency of the output signal CKout exceeds a certain multiple of the frequency of the input signal CKin. This frequency multiple can be chosen such that it is high enough to ensure that the PLL circuit has locked and is running, yet not so high that it exceeds the maximum input frequency for which the clock distribution circuitry 26 operates properly. In this way, PLL start-up circuit 200 selectively controls whether or not the Vref signal is provided to Vcntl to control the VCO 20 and thus can effectively "start" the PLL circuit 10 while preventing high frequency excursions of the PLL circuit 10.

The input signals to the PLL start-up circuit 200 are CKin and CKout. CKin is the input frequency signal provided to the PLL circuit 10, upon which the PLL circuit is designed to "lock." The CKout signal is the output signal of the PLL circuit 10, which is sent to the PLL start-up circuit 200 and through the clock distribution to form CKfb (which is then fed back to the PLL circuit 10). The input signals CKin and CKout are provided to four frequency dividers, identified in FIG. 2 by reference numerals 202(a), 202(b), 202(c), and 202(d). The frequency dividers 202 divide the input frequencies by a corresponding factor, i.e., frequency divider 202(a) divides CKin by a factor of W; frequency divider 202(b) divides CKout by a factor of X; frequency divider 202(c) divides CKin by a factor of Y; and frequency divider 202(d) divides CKout by a factor of Z. As explained hereinafter, the frequency dividers 202 are configured to establish: (i) a minimum frequency of CKout relative to CKin, below which the Vref signal will be applied to Vcntl, and (ii) a maximum frequency of CKout relative to CKin, above which the Vref signal is to be cut off from Vcntl.

The outputs of frequency dividers 202(a) and 202(b) are provided to frequency comparator 204(a) as input signals CK1(a) and CK2(a), respectively. The outputs of frequency dividers 202(c) and 202(d) are provided to frequency comparator 204(b) as input signals CK1(b) and CK2(b), respectively. The frequency comparators 204 compare the frequencies of their respective input signals, and each frequency comparator 204 generates a binary output signal indicative of the difference between the frequencies of the input signals. Specifically, the frequency comparators 204 generate a "1" if the frequency of input signal CK2 is greater than the frequency of input signal CK1. Conversely, the frequency comparators 204 generate a "0" if the frequency of input signal CK2 is less than or equal to the frequency of input signal CK1. Accordingly, in the embodiment shown in FIG. 2, frequency comparator 204(a) generates a "1" output signal if the CKout frequency divided by X is greater than the CKin frequency divided by W; frequency comparator 204(a) generates a "0" output signal if the CKout frequency divided by X is less than or equal to the CKin frequency divided by W. Similarly, frequency comparator 204(b) generates a "1" output signal if the CKout frequency divided by Z is greater than the CKin frequency divided by Y, and frequency comparator 204(b) generates a "0" output signal if the CKout frequency divided by Z is less than or equal to the CKin frequency divided by Y.

The output signals from the two frequency comparators 204 are provided as input signals to AND gate 206 and NOR gate 208, as shown in FIG. 2. The outputs of AND gate 206 and NOR gate 208 control a set/reset latch 210. In effect, the output of the NOR gate 208 is the "set" signal and the output of the AND gate 206 is the "reset" signal to the set/reset latch 210. The set/reset latch 210 generates a "start" output signal. Generally, the "start" output signal toggles to "1" when the "set" signal (from the NOR gate 208) changes from "0" to "1", and the "start" output signal toggles to "0" when the "reset" signal (from the AND gate 206) changes from "0" to "1." In the particular embodiment of the PLL start-up circuit shown in FIG. 2, the set/reset latch 210 generates a "start" output signal of "1" (indicative of a PLL "start" mode) when the frequency of the CKout signal falls below the frequency of the CKin signal by a first certain factor. The set/reset latch 210 generates an output signal of "0" (indicative of turning off the Vref signal) when the frequency of the CKout signal exceeds the frequency of the CKin signal by a second certain factor. Of course, the first and second factors may be the same or they may be different from each other. Other than when one of these events occurs, the output signal of the set/reset latch 210 maintains its existing value. With this particular configuration of the set/reset latch 210 and the AND and NOR gates, the outputs of the individual frequency comparators 204(a) and 204(b) can fluctuate without changing the output of the set/reset latch 210 until the outputs of both frequency comparators 204 change states.

The "start" signal (output from the set/reset latch 210) is provided as the control inputs to a transmission gate 214. Inverter 216 is used to ensure that the start signal is provided to both control inputs of gate 214, despite the inherent inverting feature of one of the inputs to gate 214. In this configuration, transmission gate 214 allows signal Vref to pass through to Vcntl whenever the start signal is "1" and prevents signal Vref from passing through to Vcntl whenever the start signal is "0." Relative to the frequencies of the CKin and CKout signals, the state of the start signal can be summarized by the following equations:

IF $((F_{CKout} \div X) > (F_{CKin} \div W))$ AND $((F_{CKout} \div Z) > (F_{CKin} \div Y))$
THEN Start=0;
ELSE IF $((F_{CKout} \div X) <= (F_{CKin} \div W))$ AND $((F_{CKout} \div Z) <= (F_{CKin} \div Y))$
THEN Start=1;
ELSE
Start is unchanged, where $F_{CKout}$ and $F_{CKin}$ represent the frequencies of the CKout and CKin signals, respectively. In this way, the Vref signal is selectively provided to the PLL control voltage Vcntl under certain conditions determined by the relative frequencies of the CKin and CKout signals. Here, the Vref signal is applied to Vcntl if $F_{CKout}$ falls below the smaller of Z/Y times $F_{CKin}$ and X/W times $F_{CKin}$. The Vref signal is cut off from Vcntl if $F_{CKout}$ rises above the greater of X/W times $F_{CKin}$ and Z/Y times $F_{CKin}$. In one certain embodiment of the invention, it has been determined that it is useful to specify the frequency dividers 202 such that W=6; Y=6; X=16; and Z=2. Accordingly, the Vref signal is applied to Vcntl if the frequency the output signal CKout falls below ⅓ (i.e., ⅖) of the frequency of the input signal CKin. Conversely, the Vref signal is cut off from Vcntl if the frequency of the output signal CKout exceeds 8/3 (i.e., 16/6) times the frequency of the input signal CKin.

The operation of the exemplary PLL start-up circuit 200 will now be described in additional detail. When an input signal CKin is provided to the PLL circuit 10, but the PLL circuit 10 has not yet been started, the frequency of the output signal CKout will be zero, which is less than Z/Y and X/W times the frequency of the CKin signal. Specifically, the frequency of the CK2(a) signal (of frequency comparator 204(a)) will be less than the frequency of the CK1(a) signal (of frequency comparator 204(a)), resulting in an output signal of frequency comparator 204(a) of 0. Similarly, the frequency of the CK2(b) signal (of frequency comparator 204(b)) will be less than the frequency of the CK1(b) signal (of frequency comparator 204(b)), resulting in an output signal of frequency comparator 204(b) of 0. Thus, the "start" signal is 1, thereby causing the Vref signal to be provided to the PLL control voltage Vcntl. This behavior of Vcntl effectively "starts" the PLL circuit.

The Vref signal continues to be applied to the PLL control voltage Vcntl until the frequency of the output signal CKout rises above the greater of X/W times the frequency of the CKin signal and Z/Y times the frequency of the CKin signal. Specifically, if the frequency of the CKout signal exceeds both X/W and Z/Y times the frequency of CKin, then the frequency of the CK2(a) signal (of frequency comparator 204(a)) will be greater than the frequency of the CK1(a) signal (of frequency comparator 204(a)), resulting in an output of frequency comparator 204(a) of 1. Similarly, the frequency of the CK2(b) signal (of frequency comparator 204(b)) will be greater than the frequency of the CK1(b) signal (of frequency comparator 204(b)), resulting in an output of frequency comparator 204(b) of 1. Therefore, the start signal will change from 1 to 0, thereby causing gate 214 to cut off the Vref signal from Vcntl. Once Vref is cut off from the Vcntl signal, the PLL feedback signal CKfb begins adjusting Vcntl to achieve lock. The Vref signal remains cut off from Vcntl unless and until the frequency of the output signal CKout falls below both Z/Y and X/W times the frequency of the input signal CKin, at which point the start signal is toggled from 0 to 1, thereby turning the start signal on.

By way of illustration, using the above-disclosed exemplary values for frequency dividers W-X (i.e., W=6; Y=6; X=16; and Z=2), the Vref signal will be applied to Vcntl when the frequency of the CKin signal is more than 3 times (6÷2) as great as the CKout signal, which indicates that the PLL circuit 10 has either not yet been started or is slowing down to the point where it is stopping and needs to be restarted. Further, the Vref signal will be cut off from Vcntl when the frequency of the CKout signal exceeds 8/3 times (16÷6) the frequency of the CKin signal, which may indicate a condition wherein it is probable that the PLL circuit 10 has started and it is no longer necessary to apply the Vref signal to the PLL circuit 10. In this particular embodiment, high frequency excursions of the PLL circuit 10 are prevented by turning the start signal off once the frequency of CKout exceeds 8/3 times the frequency of the CKout signal. Further, if the frequency of the CKout signal falls below one third of the frequency of the CKin signal, then the PLL start-up circuit 210 automatically applies the Vref reference voltage to Vcntl to start the PLL circuit 10.

While the invention has been described in reference to a particular embodiment thereof, the invention may be embodied in other specific forms without departing from its spirit or essential characteristics. For instance, the PLL start-up circuit 200 may be used to initialize a wide variety of different PLL circuits. Accordingly, the described embodiment is to be considered in all respects only as illustrative and not restrictive. The scope of the invention is, therefore, indicated by the appended claims rather than by the foregoing description. All changes that come within the meaning and range of equivalency of the claims are to be embraced within their scope.

The invention claimed is:

1. An electrical circuit, comprising:
    a phase locked loop circuit; and
    a PLL start-up circuit configured to selectively provide a reference signal to said phase locked loop circuit based upon relative frequencies of an input signal to said phase locked loop circuit and an output signal of said phase locked loop circuit, said relative frequencies being determined using at least two frequency comparators, wherein two of said frequency comparators comprise frequency adjustable inputs for adjusting said frequency of said input signal and said frequency of said output signal.

2. The electrical circuit of claim 1, wherein at least one of said frequency comparators comprises at least one frequency adjustable input.

3. The electrical circuit of claim 2, wherein said at least one frequency adjustable input comprises a frequency divider.

4. The electrical circuit of claim 1, further comprising a frequency divider configured to modify at least one of said input signal and said output signal and to provide said modified signal to said frequency comparator.

5. The electrical circuit of claim 1, further comprising a set/reset latch responsive to said at least two frequency comparators, said set/reset latch providing a latch output signal dependent upon the output signals of said at least two frequency comparators.

6. The electrical circuit of claim 5, wherein said reference signal is selectively provided to said phase locked loop circuit in response to said latch output signal.

7. The electrical circuit of claim 5, further comprising a gate that selectively provides a reference voltage to said phase locked loop circuit in response to said latch output signal.

8. An electrical circuit for controlling a phase locked loop circuit, comprising:
    at least two comparators configured to compare respective frequencies of an input signal to the phase locked loop circuit and an output signal of the phase locked loop circuits wherein at least two of said at least two comparators include frequency dividers for dividing said input signal and said output signal; and
    a reference signal configured to be selectively provided to the phase looked loop circuit in response to said comparison of said respective frequencies of said input signal and said output signal.

9. The electrical circuit of claim 8, wherein said reference signal is configured to be provided to the phase locked loop circuit when said frequency of said output signal falls below said frequency of said input signal by a lower limit factor.

10. A method for controlling a phase locked loop circuit, comprising the step of:
    providing a first divided input signal of the phase locked loop circuit and a first divided output signal of the phase locked loop circuit to a first frequency comparator;

providing a second divided input signal of the phase locked loop circuit and a second divided output signal of the phase locked loop circuit to a second frequency comparator; and selectively providing a reference signal to the phase locked loop circuit in response to the output of said first frequency comparator and the output of said second frequency comparator.

11. The method of claim 10, further comprising the step of:

providing said reference signal if said frequency of said input signal of the phase locked loop circuit exceeds said frequency of said output signal of the phase locked loop circuit by a first determined factor.

12. An electrical circuit, comprising:

a phase locked loop circuit;

first means for comparing relative frequencies of an input signal to said phase locked loop circuit and an output signal of said phase locked loop circuit;

second means for comparing relative frequencies of said input signal to said phase locked loop circuit and said output signal of said phase locked loop circuit; and means for selectively providing a reference signal to the phase locked loop circuit in response to said first means for comparing and said second means for comparing, wherein said means for selectively providing a reference signal comprises:

means for adjusting said respective frequencies of said input signal and said output signal; and means for comparing said modified frequencies of said input signal and said output signal.

13. An electrical circuit for controlling a phase locked loop circuit, comprising:

at least one comparator configured to compare respective frequencies of an input signal to the phase locked loop circuit and an output signal of the phase locked loop circuit;

a reference signal configured to be selectively provided to the phase locked loop circuit in response to said comparison of said respective frequencies of said input signal and said output signal;

wherein said reference signal is configured to be provided to the phase locked loop circuit when said frequency of said output signal falls below said frequency of said input signal by a lower limit factor; and wherein said reference signal is configured to be removed from the phase locked loop circuit when said frequency of said output signal rises above said frequency of said input signal by an upper limit factor.

14. The electrical circuit of claim 13, wherein said lower limit factor is less than one; and wherein said upper limit factor is greater than one.

15. The electrical circuit of claim 13, further comprising a first frequency comparator and a second frequency comparator, said first and second frequency comparators being configured to compare respective frequencies of said input signal and said output signal.

16. The electrical circuit of claim 15, further comprising at least one frequency divider communicating with each of said first and second frequency comparators, said frequency divider being configured to adjust said respective frequencies of at least one of said input and output signals prior to being provided to said first and second frequency comparators.

17. The electrical circuit of claim 16, further comprising a set/reset latch circuit connected between said first and second frequency comparators and said reference signal.

18. The electrical circuit of claim 15, further comprising a gate connected between said set/reset latch and said reference signal, said gate being configured to selectively provide said reference signal to the phase locked loop circuit in response to an output of said set/reset latch.

19. A method for controlling a phase locked loop circuit, comprising the step of:

selectively providing a reference signal to the phase locked loop circuit in response to relative frequencies of an input signal to the phase locked loop circuit and an output signal of the phase locked loop circuit;

providing said reference signal if said frequency of said input signal exceeds said frequency of said output signal by a first determined factor; and removing said reference signal from the phase locked loop if said frequency of said output signal exceeds said frequency of said input signal by a second determined factor.

20. The method of claim 19, wherein neither said first determined factor nor said second determined factor is one.

21. The method of claim 19, wherein said first determined factor is less than said second determined factor.

* * * * *

UNITED STATES PATENT AND TRADEMARK OFFICE
CERTIFICATE OF CORRECTION

| | |
|---|---|
| PATENT NO. | : 7,317,778 B2 |
| APPLICATION NO. | : 10/355516 |
| DATED | : January 8, 2008 |
| INVENTOR(S) | : Daniel Krueger et al. |

It is certified that error appears in the above-identified patent and that said Letters Patent is hereby corrected as shown below:

Column 6, line 51, in Claim 8, delete "circuits" and insert -- circuit, --, therefor.

Column 6, line 55, in Claim 8, delete "looked" and insert -- locked --, therefor.

Signed and Sealed this

Eighth Day of April, 2008

JON W. DUDAS
*Director of the United States Patent and Trademark Office*